United States Patent
Fazan et al.

[11] Patent Number: 6,087,700
[45] Date of Patent: *Jul. 11, 2000

[54] GATE HAVING A BARRIER OF TITANIUM SILICIDE

[75] Inventors: Pierre C. Fazan, Boise, Id.; Hiang C. Chan, Fremont, Calif.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/021,729

[22] Filed: Feb. 11, 1998

Related U.S. Application Data

[62] Division of application No. 08/649,803, May 17, 1996, Pat. No. 5,798,296.

[51] Int. Cl.[7] .................................................. H01L 21/76
[52] U.S. Cl. .................................... 257/413; 438/592
[58] Field of Search ............................. 257/413; 438/592

[56] References Cited

U.S. PATENT DOCUMENTS

| | | |
|---|---|---|
| 4,886,764 | 12/1989 | Miller et al. . |
| 4,900,690 | 2/1990 | Tamura . |
| 4,974,056 | 11/1990 | Brodsky et al. . |
| 5,023,201 | 6/1991 | Stanasolovich et al. . |
| 5,138,432 | 8/1992 | Stanasolovich et al. . |
| 5,202,287 | 4/1993 | Joshi et al. . |
| 5,364,803 | 11/1994 | Lur et al. . |
| 5,572,046 | 11/1996 | Takemura ................................ 257/66 |
| 5,654,241 | 8/1997 | Kakumu .................................. 438/306 |

FOREIGN PATENT DOCUMENTS 63-197359  8/1988  Japan ...................................... 257/413

OTHER PUBLICATIONS

Adler, E., M. Ishaq; "Process for Fabricating Field–Effect Transistors with Polysilicon Gates containing Metal Silicide"; IBm Technical Disclosure Bulletin; vol. 26, No. 5, Oct. 1983.

"Underlayer for Polycide Process"; IBM Technical Disclosure Bulletin; vol. 28, No. 5, Feb. 1986.

*Primary Examiner*—Olik Chaudhuri
*Assistant Examiner*—Howard Weiss
*Attorney, Agent, or Firm*—Thorp Reed & Armstrong

[57] ABSTRACT

A method of fabricating a gate having a barrier layer of titanium silicide is comprised of the steps of forming a layer of gate oxide. The gate oxide may be formed using a standard LOCOS process. A layer of doped polysilicon is deposited over the layer of gate oxide. A layer of titanium silicide is formed in a predetermined relationship with respect the layer of doped polysilicon, i.e., it may be deposited on top of the polysilicon or formed in a top surface of the polysilicon layer. A layer of tungsten silicide is deposited on top of the layer of titanium silicide. The layers of gate oxide, doped polysilicon, titanium silicide, and tungsten silicide are etched to form the gate. A gate thus fabricated is also disclosed.

21 Claims, 4 Drawing Sheets

GATE HAVING A BARRIER OF TITANIUM SILICIDE

This is a divisional of U.S. patent application Ser. No. 08/649,803 filed on May 17, 1996 now U.S. Pat. No. 5,798,296.

BACKGROUND OF THE INVENTION

1. Field of the Invention

The present invention is directed generally to processes used in the fabrication of solid state devices and, more particularly, to processes used to fabricate gate structures for transistors and the like.

2. Description of the Background

Tungsten silicide ($WSi_x$) has achieved wide-spread use within the integrated circuit fabrication industry. Specifically, because of its low resistivity, tungsten silicide has been applied as polycide, cladding both the polysilicon gate and interconnect structures. Tungsten silicide is deposited by chemical vapor deposition (CVD) using SiH4 reduction of WF6. That chemistry, however, has a disadvantage because it produces a high level of fluorine. The fluorine diffuses into the gate oxide after a high temperature anneal and degrades the gate oxide strength.

The migration of fluorine into the gate oxide to degrade the gate oxide has been known for a number of years. A paper entitled "Direct Evidence of Gate Oxide Thickness Increase In Tungsten Polycide Processes" by S. L. Hsu et al. IEEE Electron Device Letters, Volume 12, No. 11, November 1991, pp. 623–625, demonstrates that fluorine atoms migrate from a tungsten silicide layer to a gate oxide layer causing additional oxide growth. The additional gate oxide causes device degradation such as causing shifts in threshold voltages and decreases in saturation current.

One attempt at solving the problem is found in U.S. Pat. No. 5,364,803 entitled "Method of Preventing Fluorine-Induced Gate Oxide Degradation in $WSI_x$ Polycide Structure". Disclosed in that patent is a method wherein a thin, conducting, diffusion barrier layer is deposited over the gate polysilicon layer. The thin, conducting, barrier layer is preferably sputtered titanium nitride ($TiN_x$) having a preferred thickness of between about 150 to 1,500 angstroms. $N_2$ is fed into a sputter chamber with a titanium target. The sputtered titanium atoms react with the $N_2$ to form $TiN_x$ on a silicon wafer. Other conductive barrier layers for the diffusion barrier layer are titanium tungsten (TiW) or tantalum nitride (TAN) which are sputtered in a way similar to the sputtering of the titanium nitride.

The barrier layer disclosed in U.S. Pat. No. 5,364,803 minimizes the number of fluorine atoms diffusing from the tungsten silicide layer into the gate oxide layer. However, the barrier layer thus produced may increase the resistance of the gate structure. Also, the sputtering process may be inefficient and difficult to control such that the thickness and properties of the barrier layer cannot be precisely controlled. Furthermore, the sputtering process adds material to the gate structure, thereby increasing the height of that structure. Thus, the need exists for a method of constructing a barrier layer having characteristics which can be precisely controlled using commercially available process steps. The need also exists for a barrier layer of low resistance and which does not add height to the gate structure.

SUMMARY OF THE INVENTION

The present invention is directed to a method of fabricating a gate having a barrier layer of titanium silicide, comprising the steps of forming a layer of gate oxide. The gate oxide may be formed after a standard LOCOS process. A layer of doped polysilicon is deposited over the layer of gate oxide. A layer of titanium silicide is formed in a predetermined relationship with respect the layer of doped polysilicon, i.e., on top of the polysilicon or formed in a top surface of the polysilicon layer. A layer of tungsten silicide is deposited on top of the layer of titanium silicide. The layers of gate oxide, doped polysilicon, titanium silicide, and tungsten silicide are etched to form the gate.

As noted, the layer of titanium silicide may be formed in a number of ways. For example, the layer of titanium silicide may be sputtered or deposited using a chemical vapor deposition technique. However, in the preferred embodiment, a shallow titanium implant is performed. Thereafter, an annealing step is added to the process after the layer of tungsten silicide has been added such that the titanium implant reacts with Si to form a thin titanium silicide barrier layer which will act as a sink for fluorine. Using the implant and anneal process enables the thickness of the barrier layer to be precisely controlled. Furthermore, because the barrier layer is formed by a titanium implant, the overall height of the gate structure is not increased. Regardless of the precise method used to create the titanium silicide layer, the titanium silicide layer offers a lower resistance than barrier layers found in the prior art, thereby improving performance of the gate structure. Those advantages and benefits of the present invention, and others, will become apparent from the Description Of The Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
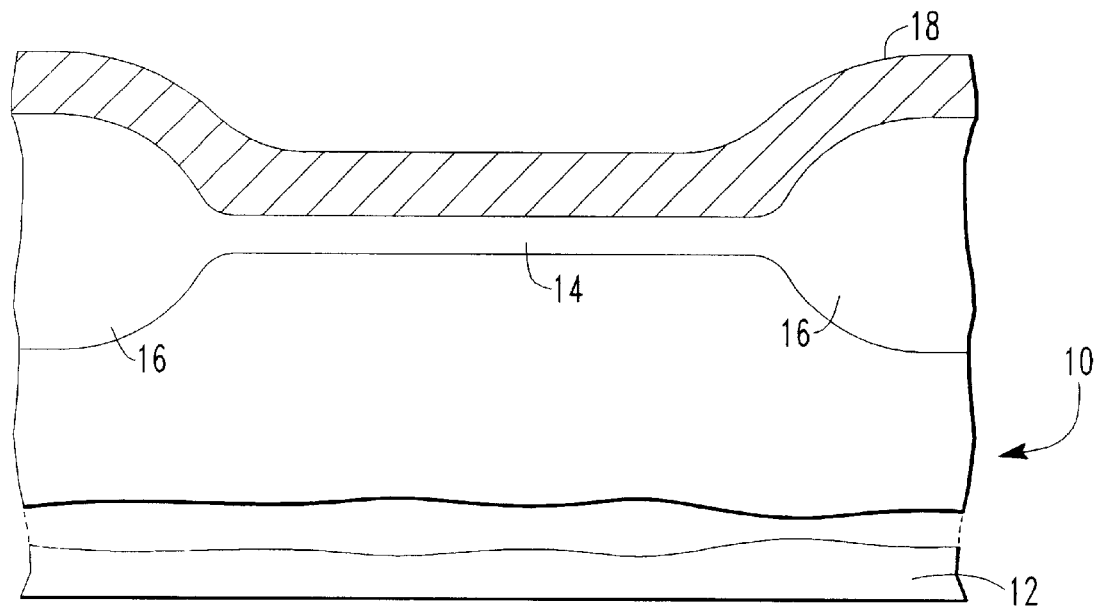
FIG. 1 illustrates a portion of a wafer on which a LOCOS process has been performed, a gate oxide has been grown, and a layer of polysilicon has been deposited.

The method of the present invention is described in connection with FIGS. 1 through 5. In FIG. 1, a portion of a wafer 10 is illustrated. The wafer 10 is comprised of a substrate 12 which is subjected to a LOCOS process to produce gate oxide regions 14 surrounded by field oxide regions 16. As is known in the art, the gate oxide 14 may consist of the pad oxide used in the LOCOS process, or it may be regrown after pad oxide removal, or even after pad oxide removal, sacrificial oxide growth and removal, if desired. The particular process steps used on the substrate 12 to produce gate oxide regions 14 and field oxide regions 16 does not represent a feature of the present invention and is therefore not further described. After the substrate 12 is configured to provide gate oxide regions 14 separated by field oxide regions 16, a layer 18 of polysilicon is deposited.

Figure 2:
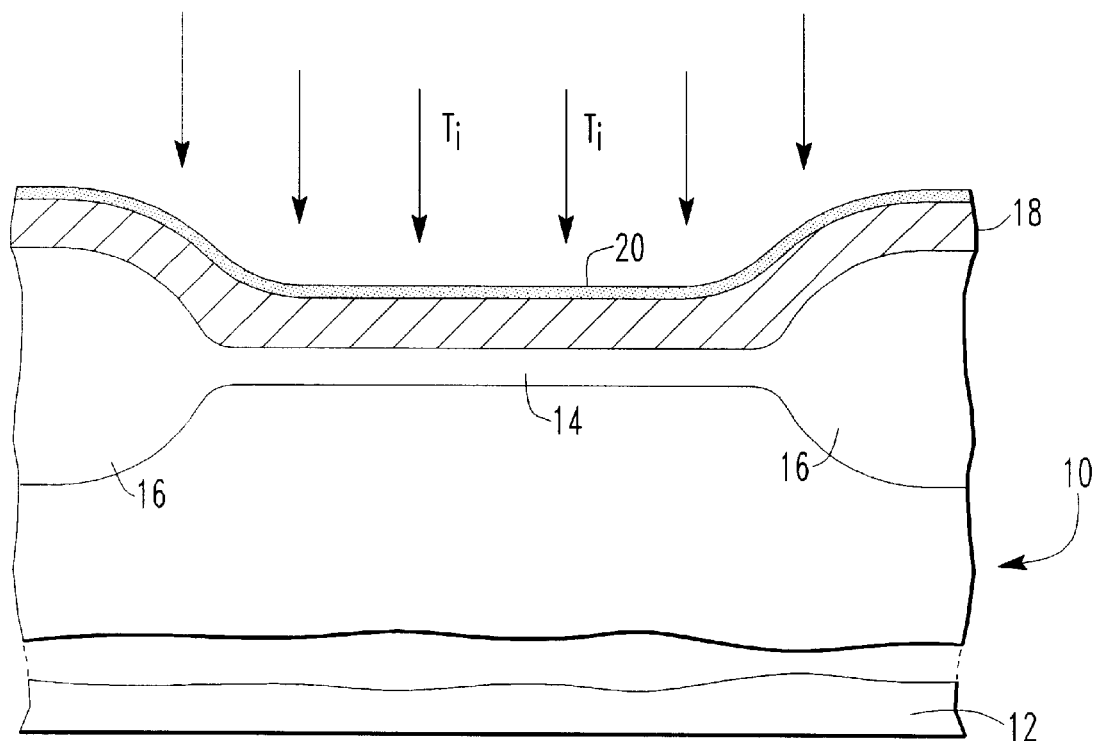
FIG. 2 illustrates the portion of the wafer shown in FIG. 1 after a titanium implant step.

In FIG. 2, the layer 18 of polysilicon is doped with, for example, phosphorus atoms. Following that, a shallow titanium implant is performed to form a titanium implant area 20 in the top surface of polysilicon layer 18. Most of the titanium atoms will cluster near the top surface of the polysilicon layer 20. Although implantation is the preferred method, titanium may also be introduced by sputtering or CVD in which case a layer of titanium (not shown) is formed on top of the layer of doped polysilicon 18. If sputtering or CVD techniques are used, the overall height of the gate structure will be increased. However if the implantation method is used, the overall height of the gate structure will not be increased.

Figure 3:
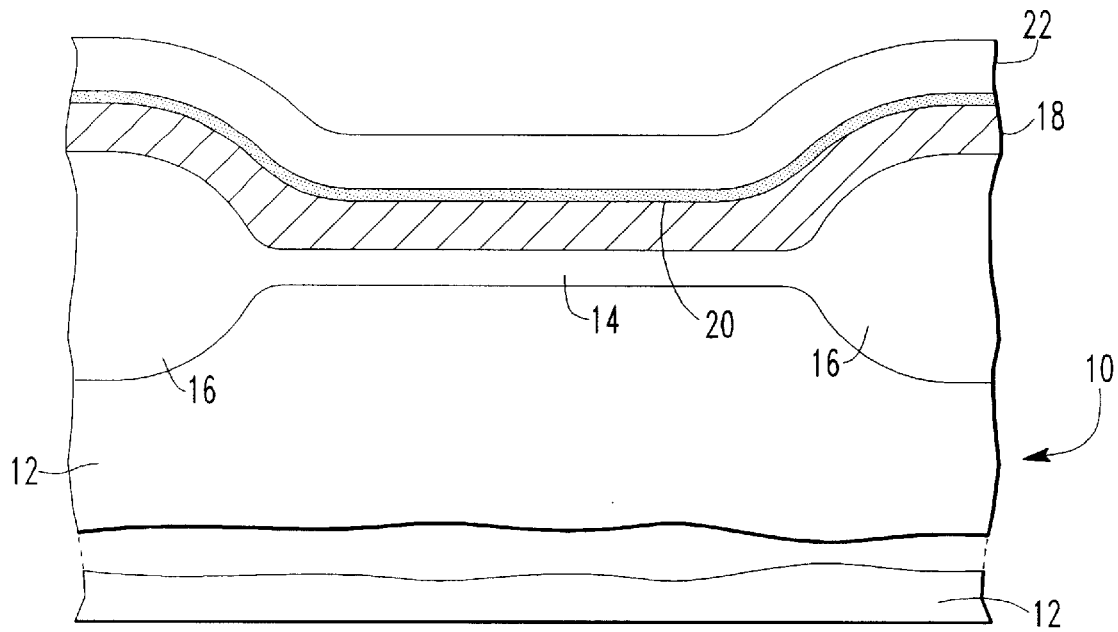
FIG. 3 illustrates the portion of the wafer shown in FIG. 2 after a layer of $WSi_x$ is deposited.
Figure 4:
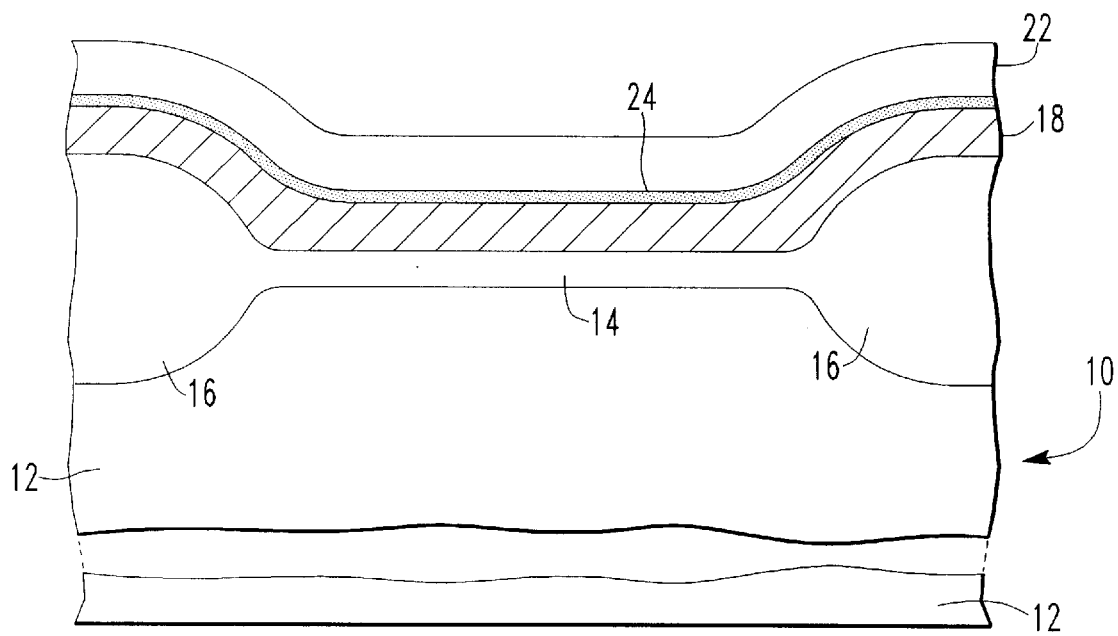
FIG. 4 illustrates the portion of the wafer shown in FIG. 3 after the wafer has been annealed to form a barrier layer of titanium silicide where the titanium implant was performed.

Turning to FIG. 3, a layer of tungsten silicide 22 is deposited on top of the polysilicon layer 18. Alternatively, if a layer of titanium is sputtered or deposited by CVD techniques on top of the polysilicon layer 18, then the tungsten silicide layer 22 is deposited on top of the titanium layer.

The wafer 10 as shown in FIG. 3 is subjected to an annealing step. The annealing step causes the titanium to react with Si from the polysilicon 18 to form a thin titanium silicide (TiSi2) barrier 24 shown in FIG. 4. According to the preferred embodiment, the characteristics of the titanium silicide barrier 24 may be precisely controlled in a manner which does not increase the overall height of the gate structure. The titanium silicide barrier 24 acts as a sink for fluorine.

Figure 5:
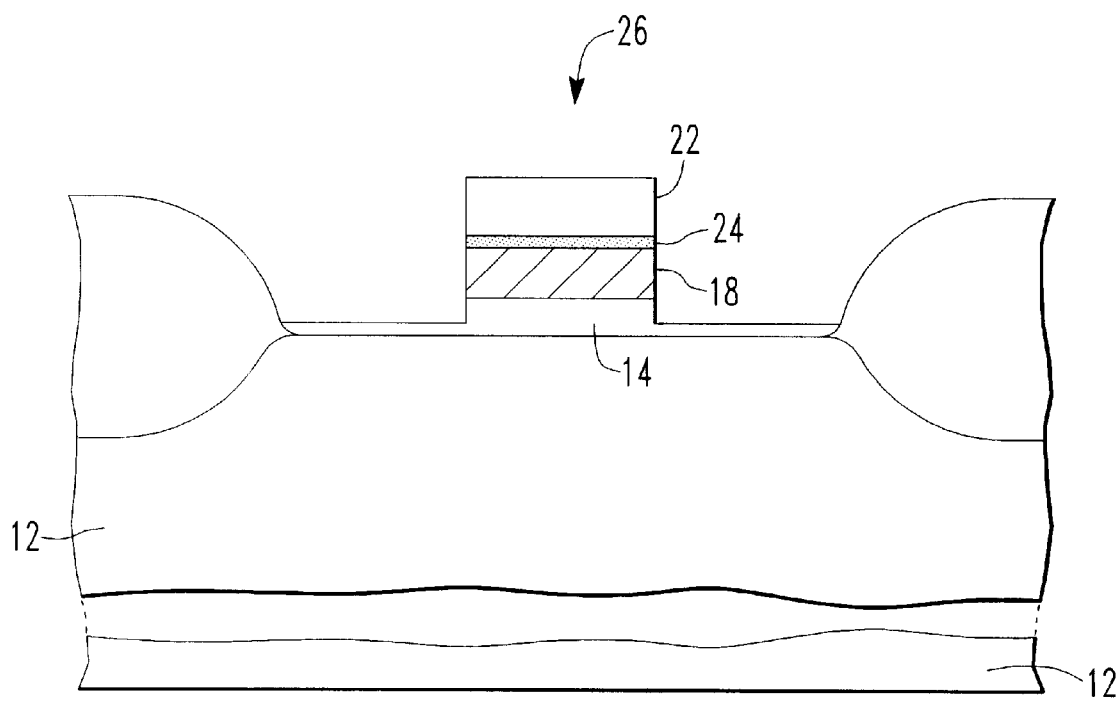
FIG. 5 illustrates the portion of the wafer shown in FIG. 4 after the wafer has been etched according to a gate pattern.

Thereafter, as shown in FIG. 5, the gate oxide region 14, polysilicon layer 18, titanium silicide barrier 24, and tungsten silicide layer 22 are etched to form a gate structure 26. The titanium silicide barrier 24 prevents fluorine from migrating from the tungsten silicide layer 22 to the gate oxide 14.

As previously discussed, the titanium silicide barrier 24 is preferably formed by implantation and an annealing step such that the barrier layer 24 is formed in the polysilicon layer 18. If the titanium is deposited by sputtering or CVD techniques, then the barrier layer 24 will be formed on top of the polysilicon layer 18. In either event, the barrier layer is relatively thin, on the order of 100–500 angstroms. Furthermore, the barrier layer, by virtue of being formed of titanium silicide, has a very low resistance. Because of the low resistance, the ability to precisely control the characteristics of the barrier layer 24 using known, conventional processing techniques, and the fact that the barrier layer, according to the preferred embodiment, does not increase the height of the gate structure 26, the present invention represent substantial advantages over the prior art.

Figure 6:
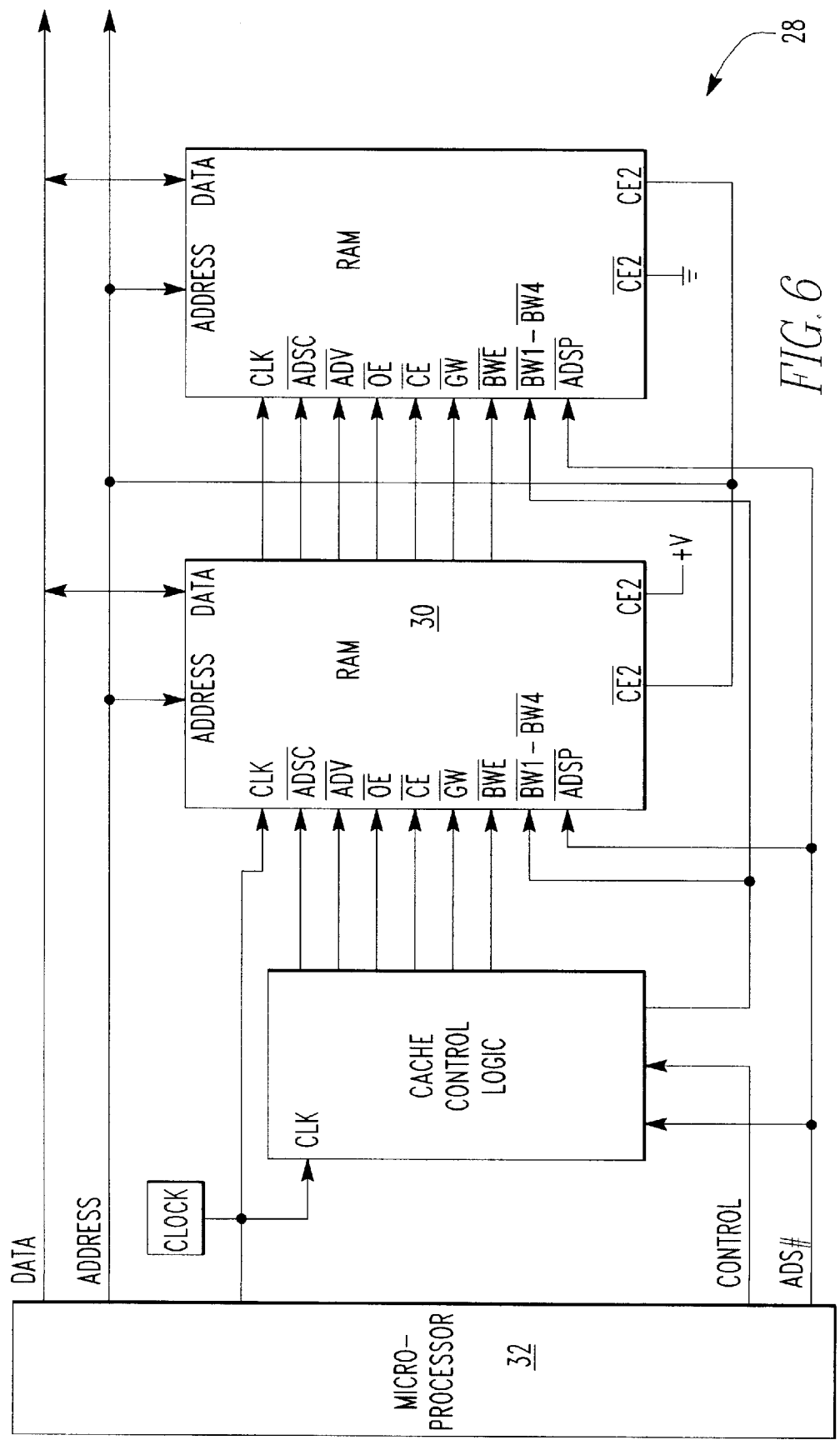
FIG. 6 illustrates a system in which gates having barrier layers constructed according to the teachings of the present invention may be used.

FIG. 6 illustrates a system 28 in which the present invention may be employed. The system is comprised of a solid state device, such as a memory device 30, in which gate structures having barrier layers constructed according to the teachings of the present invention may be fabricated. The memory device 30 is under the control of a microprocessor 32, which may be programmed to carry out particular functions as is known in the art. The microprocessor 32 could have gate structures having barrier layers constructed according to the teachings of the present invention. In fact, any microchip could have such gate structures.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A substrate carrying a gate structure, comprising:

a layer of gate oxide;

a layer of doped polysilicon positioned on top of said layer of gate oxide;

a layer of titanium silicide shallowly implanted in said layer of doped polysilicon only in the area forming the gate structure such that the height of the layer of doped polysilicon is not increased; and a layer of tungsten silicide positioned on top of said layer of titanium silicide.

2. A combination, comprising:

a substrate;

a layer of gate oxide carried by said substrate;

a layer of doped polysilicon positioned on top of said layer of gate oxide;

a layer of titanium silicide shallowly implanted in said layer of doped polysilicon only in the area forming the gate structure such that the height of the layer of doped polysilicon is not increased; and a layer of tungsten silicide positioned on top of said layer of titanium silicide.

3. A system, comprising:

a microprocessor;

a memory device in communication with said microprocessor, at least one of said microprocessor and said memory device having a transistor having a gate structure including a layer of gate oxide, a layer of doped polysilicon positioned on top of said layer of gate oxide, a layer of titanium silicide shallowly implanted in said layer of doped polysilicon only in the area forming the gate structure such that the height of the layer of doped polysilicon is not increased, and a layer of tungsten silicide positioned on top of said layer of titanium silicide.

4. A substrate carrying a layer of polysilicon and a gate structure, comprising:

a layer of titanium silicide shallowly implanted in the layer of polysilicon only in the area forming the gate structure such that the height of the layer of doped polysilicon is not increased; and a layer of silicide positioned on top of said layer of titanium silicide.

5. A semiconductor device, comprising:

a substrate assembly; and at least one gate structure located on said substrate assembly, said gate structure having a layer of polysilicon, said gate structure comprising:

a layer of titanium silicide shallowly implanted in the layer of polysilicon only in the area forming the gate structure such that the height of the layer of doped polysilicon is not increased; and a layer of silicide positioned on top of said layer of titanium silicide.

6. A system, comprising:

a microprocessor; and a memory device in communication with said microprocessor, at least one of said microprocessor and said memory device having a semiconductor device having a gate structure, the gate structure having a layer of polysilicon, the gate structure comprising:

a layer of titanium silicide shallowly implanted in the layer of polysilicon only in the area forming the gate structure such that the height of the layer of doped polysilicon is not increased; and a layer of tungsten silicide positioned on top of said layer of titanium silicide.

7. The substrate of claim 1 wherein said layer of titanium silicide is on the order of 100–500 angstroms thick.

8. The substrate of claim 1 wherein said layer of titanium silicide is of sufficient thickness to act as a barrier to the migration of fluorine.

9. The combination of claim 2 wherein said layer of titanium silicide is on the order of 100–500 angstroms thick.

10. The combination of claim 2 wherein said layer of titanium silicide is of sufficient thickness to act as a barrier to the migration of fluorine.

11. The substrate of claim 4 wherein said layer of titanium silicide is on the order of 100–500 angstroms thick.

12. The substrate of claim 4 wherein said layer of titanium silicide is of sufficient thickness to act as a barrier to the migration of fluorine.

13. The substrate of claim 4 wherein said layer of silicide positioned on top of said layer of titanium silicide includes a layer of tungsten silicide.

14. The semiconductor device of claim 5 wherein said layer of titanium silicide is on the order of 100–500 angstroms thick.

15. The semiconductor device of claim 5 wherein said layer of titanium silicide is of sufficient thickness to act as a barrier to the migration of fluorine.

16. The semiconductor device of claim 5 wherein said layer of silicide positioned on top of said layer of titanium silicide includes a layer of tungsten silicide.

17. A substrate carrying a gate structure having a barrier layer for preventing the migration of fluorine, comprising:

a layer of gate oxide;

a layer of polysilicon positioned on top of said layer of gate oxide;

a thin layer of titanium silicide formed in, and at the top of, said layer of polysilicon only in the area forming the gate structure such that the height of the layer of doped polysilicon is not increased; and a layer of tungsten silicide positioned on top of said layer of titanium silicide.

18. The substrate of claim 17 wherein said layer of titanium silicide is on the order of 100–500 angstroms thick.

19. A substrate carrying a gate structure having a layer of polysilicon and a barrier layer to prevent the migration of fluorine, comprising:

a thin layer of titanium silicide formed at the top of, and in, the layer of polysilicon only in the area forming the gate structure such that the height of the layer of doped polysilicon is not increased; and a layer of silicide positioned on top of said layer of titanium silicide.

20. The substrate of claim 19 wherein said thin layer of titanium silicide is on the order of 100–500 angstroms thick.

21. The substrate of claim 19 wherein said layer of silicide positioned on top of said layer of titanium silicide includes a layer of tungsten silicide.

\* \* \* \* \*